United States Patent
Brown Elliot

(10) Patent No.: US 7,274,383 B1
(45) Date of Patent: *Sep. 25, 2007

(54) ARRANGEMENT OF COLOR PIXELS FOR FULL COLOR IMAGING DEVICES WITH SIMPLIFIED ADDRESSING

(75) Inventor: Candice Hellen Brown Elliot, Vallejo, CA (US)

(73) Assignee: Clairvoyante, Inc, Sebastopol, CA (US)

( * ) Notice: Subject to any disclaimer, the term of this patent is extended or adjusted under 35 U.S.C. 154(b) by 326 days.

This patent is subject to a terminal disclaimer.

(21) Appl. No.: 09/628,122

(22) Filed: Jul. 28, 2000

(51) Int. Cl.
 G09G 5/02 (2006.01)
 G09G 3/28 (2006.01)
 G09G 3/32 (2006.01)
 G09G 3/36 (2006.01)

(52) U.S. Cl. ............ 345/694; 345/690; 345/597; 345/598; 345/589; 345/695

(58) Field of Classification Search ........ 345/613–618, 345/83, 88, 471, 472, 611, 589–606, 72, 690–695; 348/597, 340, 155, 369, 264, 803
See application file for complete search history.

(56) References Cited

U.S. PATENT DOCUMENTS

| | | |
|---|---|---|
| 3,971,065 A | 7/1976 | Bayer |
| 4,353,062 A | 10/1982 | Lorteije et al. |
| 4,593,978 A | 6/1986 | Mourey et al. |
| 4,642,619 A | 2/1987 | Togashi |
| 4,651,148 A | 3/1987 | Takeda et al. |
| 4,751,535 A | 6/1988 | Myers |
| 4,773,737 A | 9/1988 | Yokono et al. |
| 4,786,964 A | 11/1988 | Plummer et al. |
| 4,792,728 A | 12/1988 | Chang et al. |
| 4,800,375 A | 1/1989 | Silverstein et al. |
| 4,822,142 A | 4/1989 | Yasui |
| 4,853,592 A | 8/1989 | Strathman |
| 4,874,986 A | 10/1989 | Menn et al. |
| 4,886,343 A | 12/1989 | Johnson ............ 350/335 |
| 4,908,609 A | 3/1990 | Stroomer |
| 4,920,409 A | 4/1990 | Yamagishi ............ 358/56 |
| 4,965,565 A | 10/1990 | Noguchi |
| 4,966,441 A | 10/1990 | Conner |
| 4,967,264 A | 10/1990 | Parulski et al. |
| 5,006,840 A | 4/1991 | Hamada et al. |
| 5,052,785 A | 10/1991 | Takimoto et al. |
| 5,113,274 A | 5/1992 | Takahashi et al. |
| 5,132,674 A | 7/1992 | Bottorf |
| 5,144,288 A | 9/1992 | Hamada et al. |
| 5,184,114 A | 2/1993 | Brown |
| 5,189,404 A | 2/1993 | Masimo et al. |
| 5,233,385 A | 8/1993 | Sampsell |
| 5,311,337 A | 5/1994 | McCartney, Jr. |
| 5,315,418 A | 5/1994 | Sprague et al. ............ 359/41 |

(Continued)

FOREIGN PATENT DOCUMENTS

DE   299 09 537 U1   10/1999

(Continued)

OTHER PUBLICATIONS

Adobe Systems, Inc., website, 2002, http://www.adobe.com/products/acrobat/cooltype.html.

(Continued)

Primary Examiner—Jin-Cheng Wang

(57) ABSTRACT

A three-color pixel element for a display comprises a blue emitter disposed at the origin of a rectangular coordinate system having four quadrants, a pair of red emitters and a pair of green emitters spaced apart from the blue emitter and symmetrically disposed about the origin of the rectangular coordinate system in a first and second pair of opposing quadrants.

32 Claims, 3 Drawing Sheets

U.S. PATENT DOCUMENTS

| | | | |
|---|---|---|---|
| 5,334,996 A | 8/1994 | Tanigaki et al. | 345/152 |
| 5,341,153 A | 8/1994 | Benzschawel et al. | 345/152 |
| 5,398,066 A | 3/1995 | Martinez-Uriegas et al. | |
| 5,436,747 A | 7/1995 | Suzuki | |
| 5,461,503 A | 10/1995 | Deffontaines et al. | |
| 5,535,028 A | 7/1996 | Bae et al. | |
| 5,541,653 A | 7/1996 | Peters et al. | |
| 5,561,460 A | 10/1996 | Katoh et al. | |
| 5,563,621 A | 10/1996 | Silsby | |
| 5,579,027 A | 11/1996 | Sakurai et al. | |
| 5,642,176 A | 6/1997 | Abukawa et al. | |
| 5,646,702 A * | 7/1997 | Akinwande et al. | 349/69 |
| 5,648,793 A | 7/1997 | Chen | 345/96 |
| 5,661,371 A | 8/1997 | Salerno et al. | |
| 5,729,244 A * | 3/1998 | Lockwood | 345/75.2 |
| 5,754,226 A | 5/1998 | Yamada et al. | |
| 5,773,927 A | 6/1998 | Zimlich | |
| 5,792,579 A | 8/1998 | Phillips | |
| 5,815,101 A | 9/1998 | Fonte | |
| 5,821,913 A | 10/1998 | Mamiya | |
| 5,856,050 A | 1/1999 | Inoue et al. | |
| 5,899,550 A | 5/1999 | Masaki | |
| 5,949,496 A | 9/1999 | Kim | |
| 5,973,664 A | 10/1999 | Badger | |
| 6,002,446 A | 12/1999 | Eglit | |
| 6,005,692 A * | 12/1999 | Stahl | 359/15 |
| 6,008,868 A | 12/1999 | Silverbrook | 348/790 |
| 6,034,666 A | 3/2000 | Kanai et al. | |
| 6,037,719 A | 3/2000 | Yap et al. | |
| 6,038,031 A | 3/2000 | Murphy | |
| 6,049,626 A | 4/2000 | Kim | |
| 6,061,533 A | 5/2000 | Kajiwara | |
| 6,064,363 A | 5/2000 | Kwon | 345/98 |
| 6,072,272 A | 6/2000 | Rumbaugh | |
| 6,097,367 A | 8/2000 | Kuriwaki et al. | |
| 6,108,122 A | 8/2000 | Ulrich et al. | |
| 6,137,100 A * | 10/2000 | Fossum et al. | 250/208.1 |
| 6,144,352 A | 11/2000 | Matsuda et al. | |
| 6,147,664 A * | 11/2000 | Hansen | 345/74.1 |
| 6,151,001 A * | 11/2000 | Anderson et al. | 345/63 |
| 6,160,535 A | 12/2000 | Park | |
| 6,163,038 A * | 12/2000 | Chen et al. | 257/103 |
| 6,184,903 B1 | 2/2001 | Omori | |
| 6,188,385 B1 | 2/2001 | Hill et al. | |
| 6,198,507 B1 | 3/2001 | Ishigami | |
| 6,219,025 B1 | 4/2001 | Hill et al. | |
| 6,225,967 B1 | 5/2001 | Hebiguchi | |
| 6,225,973 B1 | 5/2001 | Hill et al. | |
| 6,236,390 B1 | 5/2001 | Hitchcock | |
| 6,239,783 B1 | 5/2001 | Hill et al. | |
| 6,243,055 B1 | 6/2001 | Fergason | |
| 6,243,070 B1 | 6/2001 | Hill et al. | |
| 6,262,710 B1 * | 7/2001 | Smith | 345/589 |
| 6,271,891 B1 | 8/2001 | Ogawa et al. | |
| 6,299,329 B1 | 10/2001 | Mui et al. | |
| 6,326,981 B1 | 12/2001 | Mori et al. | |
| 6,327,008 B1 | 12/2001 | Fujiyoshi | |
| 6,346,972 B1 | 2/2002 | Kim | |
| 6,360,023 B1 | 3/2002 | Betrisey et al. | |
| 6,377,262 B1 | 4/2002 | Hitchcock et al. | |
| 6,392,717 B1 | 5/2002 | Kunzman | |
| 6,393,145 B2 | 5/2002 | Betrisey et al. | |
| 6,429,867 B1 | 8/2002 | Deering | |
| 6,441,867 B1 | 8/2002 | Daly | |
| 6,453,067 B1 | 9/2002 | Morgan et al. | |
| 6,459,419 B1 | 10/2002 | Matsubayashi | |
| 6,466,618 B1 | 10/2002 | Messing et al. | |
| 6,469,756 B1 | 10/2002 | Booth, Jr. | |
| 6,486,923 B1 * | 11/2002 | Maeshima et al. | 348/649 |
| 6,628,068 B1 * | 9/2003 | Rorison et al. | 313/504 |
| 6,661,429 B1 * | 12/2003 | Phan | 345/694 |
| 6,680,761 B1 | 1/2004 | Greene et al. | |
| 6,903,754 B2 | 6/2005 | Brown Elliott | |
| 6,950,115 B2 | 9/2005 | Brown Elliott | |
| 6,950,156 B1 | 9/2005 | Yoshida | |
| 7,110,012 B2 | 9/2006 | Messing et al. | |
| 2001/0017515 A1 | 8/2001 | Kusunoki et al. | |
| 2001/0040645 A1 | 11/2001 | Yamazaki | |
| 2002/0012071 A1 | 1/2002 | Sun | |
| 2002/0015110 A1 | 2/2002 | Brown | |
| 2002/0017645 A1 | 2/2002 | Yamazaki et al. | |
| 2002/0122160 A1 | 9/2002 | Kunzman | |
| 2002/0140831 A1 | 10/2002 | Hayashi | |
| 2002/0180688 A1 | 12/2002 | Drzaic et al. | |
| 2002/0190648 A1 | 12/2002 | Bechtel et al. | |
| 2003/0011613 A1 | 1/2003 | Booth, Jr. | |
| 2003/0043567 A1 | 3/2003 | Hoelen | |
| 2003/0071826 A1 | 4/2003 | Goertzen | |
| 2003/0071943 A1 | 4/2003 | Choo et al. | |
| 2003/0090581 A1 | 5/2003 | Credelle et al. | |
| 2003/0117423 A1 | 6/2003 | Brown Elliott et al. | |
| 2003/0218618 A1 * | 11/2003 | Phan | 345/629 |
| 2004/0061710 A1 | 4/2004 | Messing et al. | |
| 2005/0174363 A1 | 8/2005 | Brown Elliott | |
| 2005/0248262 A1 | 11/2005 | Brown Elliott | |
| 2005/0264588 A1 | 12/2005 | Brown Elliott | |

FOREIGN PATENT DOCUMENTS

| | | |
|---|---|---|
| DE | 199 23 527 | 11/2000 |
| DE | 199 23 527 A1 | 11/2000 |
| DE | 201 09 354 U1 | 9/2001 |
| EP | 0 158 366 A2 | 10/1985 |
| EP | 0 203 005 A1 | 11/1986 |
| EP | 0 322 106 A2 | 1/1989 |
| EP | 0 671 650 | 9/1995 |
| EP | 0 878 969 | 9/1995 |
| EP | 0 793 214 A1 | 9/1997 |
| EP | 0 812 114 A1 | 12/1997 |
| EP | 0 899 604 A2 | 3/1999 |
| EP | 1083539 A2 | 3/2001 |
| EP | 1 261 014 A2 | 11/2002 |
| EP | 1 381 020 A2 | 1/2004 |
| GB | 2 133 912 A | 8/1984 |
| GB | 2 146 478 A | 4/1985 |
| JP | 60-107022 | 6/1985 |
| JP | 02-000826 A | 1/1990 |
| JP | 03-78390 | 4/1991 |
| JP | 3-36239 B | 5/1991 |
| JP | 06-102503 | 4/1994 |
| JP | 02-983027 B2 | 11/1999 |
| JP | 2001203919 | 7/2001 |
| WO | WO97/23860 | 7/1997 |
| WO | WO 00/21067 | 4/2000 |
| WO | WO 00/42564 | 7/2000 |
| WO | WO 00/42762 | 7/2000 |
| WO | WO 00/45365 | 8/2000 |
| WO | WO 00/65432 | 11/2000 |
| WO | WO 00/67196 | 11/2000 |
| WO | WO 00/70392 | 11/2000 |
| WO | WO 01/10112 A2 | 2/2001 |
| WO | WO 01/29817 A1 | 4/2001 |
| WO | WO 01/52546 A2 | 7/2001 |
| WO | WO 02/059685 A2 | 8/2002 |
| WO | WO 03/014819 A1 | 2/2003 |

OTHER PUBLICATIONS

Betrisey, C., et al., "Displaced Filtering for Patterned Displays," 2000, *Society for Information Display (SID) 00 Digest*, pp. 296-299.

Carvajal, D., "Big Publishers Looking Into Digital Books," Apr. 3, 2000, *The New York Times*, Business/Financial Desk.

Elliott, C., "Active Matrix Display Layout Optimization for Sub-pixel Image Rendering," Sep. 2000, Proceedings of the 1st International Display Manufacturing Conference, pp. 185-189.

Elliott, C., "New Pixel Layout for PenTile Matrix," Jan. 2002, Proceedings of the International Display Manufacturing Conference, pp. 115-117.

Gibson Research Corporation, website, "Sub-Pixel Font Rendering Technology, How It Works," 2002, http://www.grc/com/ctwhat.html.

Microsoft Corporation, website, 2002, http://www.microsoft.com/reader/ppc/product/cleartype.html.

Microsoft Press Release, Nov. 15, 1998, Microsoft Research Announces Screen Display Breakthrough at COMDEX/Fall '98, PR Newswire.

Murch, M., "Visual Perception Basics," 1987, SID, Seminar 2, Tektronix, Inc., Beaverton, Oregon.

Okumura, H., et al., "A New Flicker-Reduction Drive Method for High-Resolution LCTVs," May 1991, Society for Information Display (SID) International Symposium Digest of Technical Papers, pp. 551-554.

Wandell, Brian A., Stanford University, "Fundamentals of Vision: Behavior, Neuroscience and Computation," Jun. 12, 1994, Society for Information Display (SID) Short Course S-2, Fairmont Hotel, San Jose, California.

"ClearType magnified," Wired Magazine, Nov. 8, 1999, Microsoft Typography, article posted Nov. 8, 1999, and last updated Jan. 27, 1999, © 1999 Microsoft Corporation, 1 page.

Credelle, Thomas L. et al., "P-00: MTF of High-Resolution PenTile Matrix™ Displays," Eurodisplay 02 Digest, 2002, pp. 1-4.

Daly, Scott, "Analysis of Subtriad Addressing Algorithms by Visual System Models," SID Symp. Digest, Jun. 2001, pp. 1200-1203.

Elliott, Candice-H. Brown et al., "Color Subpixel Rendering Projectors and Flat Panel Displays," New Initiatives in Motion Imaging, SMPTE Advanced Motion Imaging Conference, Feb. 27-Mar. 1, 2003, Seattle, Washington, pp. 1-4.

Elliott, Candice H. Brown et al., "Co-optimization of Color AMLCD Subpixel Architecture and Rendering Algorithms," SID Symp. Digest, May 2002, pp. 172-175.

Feigenblatt, R.I., "Full-color imaging on amplitude-quantized color mosaic displays," SPIE, vol. 1075, Digital Image Processing Applications, 1989, pp. 199-204.

Johnston, Stuart J., "An Easy Read: Microsoft's ClearType," InformationWeek Online, Redmond, WA, Nov. 23, 1998, 3 pages.

Johnston, Stuart J., "Clarifying ClearType," InformationWeek Online, Redmond, WA, Jan. 4, 1999, 4 pages.

"Just Outta Beta," Wired Magazine, Dec. 1999, Issue 7.12, 3 pages.

Klompenhouwer, Michiel A. et al., "Subpixel Image Scaling for Color Matrix Displays," SID Symp. Digest, May 2002, pp. 176-179.

Lee, Baek-Woon et al., "40.5L: Late-News Paper: TFT-LCE with RGBW Color System," SID 03 Digest, 2003, pp. 1212-1215.

Markoff, John, "Microsoft's Cleartype Sets Off Debate on Originality," The New York Times, Dec. 7, 1998, 5 pages.

"Microsoft Clear Type," http://www.microsoft.com/opentype/cleartype, Sep. 26, 2002, 4 pages.

Platt, John C., "Optimal Filtering for Patterned Displays," Microsoft Research, IEEE Signal Processing Letters, 2000, 4 pages.

Platt, John, "Technical Overview of ClearType Filtering," Microsoft Research, http://research.microsoft.com/users/jplatt/cleartype/default.aspx, Sep. 17, 2002, 3 pages.

Poor, Alfred, "LCDs: The 800-pound Gorilla," Information Display, Sep. 2002, pp. 18-21.

"Ron Feigenblatt's remarks on Microsoft Clear Type™," http://www.geocities.com/SiliconValley/Ridge/6664/ClearType.html, Dec. 5, 1998, Dec. 7, 1998, Dec. 12, 1999, Dec. 26, 1999, Dec. 30, 1999, and Jun. 19, 2000, 30 pages.

"Sub-Pixel Font Rendering Technology," © 2003 Gibson Research Corporation, Laguna Hills, CA, 2 pages.

Werner, Ken, "OLEDs, OLEDs, Everywhere . . . ," Information Display, Sep. 2002, pp. 12-15.

Krantz, John H. et al., "Color Matrix Display Image Quality: The Effect of Luminance and Spatial Sampling," SID International Symposium, Digest of Technical Papers, pp. 29-32, 1990.

Messing, Dean S. et al., "Improved Display Resolution of Subsampled Colour Images Using Subpixel Addressing," Proc. Int. Conf. Image Processing (ICIP '02), Rochester, N.Y., IEEE Signal Processing Society, vol. 1, pp. 625-628, 2002.

Messing, Dean S. et al., "Subpixel Rendering on Non-Striped Colour Matrix Dispalys," International Conference on Image Processing, Barcelona, Spain, 4 pp., Sep. 2003.

PCT International Search Report for PCT/US02/39860 dated Jul. 30, 2003.

R. Martin, et al., "Detectability of Reduced Blue Pixel Court in Projection Displays", Society for Information Display, Symposium Digest, May 1993.

Lesperance, Jean E., Non-Final Office Action dated Mar. 9, 2004 in U.S. Appl. No. 09/916,232 (12 pages).

Lesperance, Jean E., Non-Final Office Action dated May 6, 2004 in U.S. Appl. No. 09/916,232 (9 pages).

Kaler, Stuart P., Response to Non-Final Office Action dated Sep. 3, 2004 in U.S. Appl. No. 09/916,232 (74 pages).

Lesperance, Jean E., Final Office Action dated Jan. 6, 2005 in U.S. Appl. No. 09/916,232 (24 pages).

Kaler, Stuart P., Response to Final Office Action dated Jan. 28, 2005 in U.S. Appl. No. 09/916,232 (36 pages).

C. Elliott, "Reducing Pixel Count without Reducing Image Quality", Information Display, vol. 15, pp. 22-25, Dec. 1999.

Non-Final Office Action, dated Jan. 15, 2004, in US Patent. 6,950,115 (U.S. Appl. No. 10/024,326) (15 pages).

Response to Non-Final Office Action (Jan. 15, 2004), dated May 10, 2004, in US Patent. 6,950,115 (U.S. Appl. No. 10/024,326) (15 pages).

Non-Final Office Action, dated Jun. 28, 2004, in US Patent. 6,950,115 (U.S. Appl. No. 10/024,326) (13 pages).

Response to Non-Final Office Action (Jun. 28, 2004), dated Oct. 27, 2004, in US Patent. 6,950,115 (U.S. Appl. No. 10/024,326) (17 pages).

Notice of Allowance, dated Jun. 1, 2005, in US Patent. 6,950,115 (U.S. Appl. No. 10/024,326) (10 pages).

Non-Final Office Action, dated Jul. 28, 2005, in US Patent Application Publication No. 2003/0090581 (U.S. Appl. No. 10/278,393) (23 pages).

Response to Non-Final Office Action (Jul. 28, 2005), dated Jan. 30, 2006, in US Patent Application Publication No. 2003/0090581 (U.S. Appl. No. 10/278,393) (25 pages).

Final Office Action, dated Apr. 18, 2006, in US Patent Application Publication No. 2003/0090581 (U.S. Appl. No. 10/278,393) (19 pages).

Non-Final Office Action, dated May 4, 2005, in US Patent Application Publication No. 2003/0117423 (U.S. Appl. No. 10/278,328) (18 pages).

Response to Non-Final Office Action (May 4, 2005), dated Nov. 3, 2005, in US Patent Application Publication No. 2003/0117423 (U.S. Appl. No. 10/278,328) (18 pages).

Final Office Action, dated Feb. 17, 2006, in US Patent Application Publication No. 2003/0117423 (U.S. Appl. No. 10/278,328) (9 pages).

PCT International Search Report dated Aug. 21, 2002 for PCT/US02/14925 (U.S. Appl. No. 10/024,326).

PCT International Search Report dated Jul. 17, 2003 for PCT/US02/39859 (U.S. Appl. No. 10/278,393).

PCT International Search Report dated Jul. 30, 2003 for PCT/US02/39860 (U.S. Appl. No. 10/278,328).

USPTO, Notice of Allowance, dated Feb. 7, 2005 in U.S. Patent No. 6,903,754 (U.S. Appl. No. 09/916,232).

Clairvoyante Inc, Response to Non-Final Office Action, dated Sep. 18, 2006 in US Patent Publication No. 2003/0090581, (U.S. Appl. No. 10/278,393).

USPTO, Non-Final Office Action, dated Nov. 14, 2006 in US Patent Publication No. 2003/0090581, (U.S. Appl. No. 10/278,393).

USPTO, Interview Summary, dated Mar. 17, 2006 in US Patent Publication No. 2003/0117423, (U.S. Appl. No. 10/278,328).

Clairvoyante Inc, Response to Final Office Action, dated Aug. 16, 2006 in US Patent Publication No. 2003/0117423, (U.S. Appl. No. 10/278,328).

USPTO, Non-Final Office Action, dated Nov. 15, 2006 in US Patent Publication No. 2003/0117423, (U.S. Appl. No. 10/278,328).

* cited by examiner

ARRANGEMENT OF COLOR PIXELS FOR FULL COLOR IMAGING DEVICES WITH SIMPLIFIED ADDRESSING

BACKGROUND OF THE INVENTION

1. Field of the Invention

The present invention relates to color pixel arrangements. Specifically the present invention relates to color pixel arrangements used in electronic imaging devices and displays.

2. The Prior Art

Full color perception is produced in the eye by three-color receptor nerve cell types called cones. The three types are sensitive to different wave lengths of light: long, medium, and short ("red", "green", and "blue" respectively). The relative density of the three differs significantly from one another. There are slightly more red receptors than green. There are very few blue receptors compared to red or green. In addition to the color receptors there are relative wavelength insensitive receptors called rods that contribute to monochrome night vision.

The human vision system processes the information detected by the eye in several perceptual channels; luminance, chromanance, and motion. Motion is only important for flicker threshold to the imaging system designer. The luminance channel takes the input from all of the available receptors, cones and rods. It is "color blind". It processes the information in such a manner that the contrast of edges is enhanced. The chroma channel does not have edge contrast enhancement. Since the luminance channel uses and enhances every receptor, the resolution of the luminance channel is several times higher than the chroma channel. The blue receptor contribution to luminance perception is less than 5%, or one part in twenty. Thus the error introduced by lowering the blue resolution by one octave will be barely noticeable by the most perceptive viewer, if at all, as experiments at NASA, Ames Research Center (R. Martin, J. Gille, J. Larimer, Detectability of Reduced Blue Pixel Count in Projection Displays, SID Digest 1993) have demonstrated.

Color perception is influenced by a process called "assimilation" or the Von Bezold color blending effect. This is what allows separate color pixels (called "subpixels" by some authors) of a display to be perceived as the mixed color. This blending effect happens over a given angular distance in the field of view. Because of the relatively scarce blue receptors this blending happens over a greater angle for blue than for red or green. This distance is approximately 0.25° for blue, while for red or green it is approximately 0.12°. At a viewing distance of twelve inches, 0.25° subtends 50 mils (1,270μ) on a display. Thus, if the blue pixel pitch is less than half (625μ) of this blending pitch, the colors will blend without loss of picture quality.

The present state of the art color single plane imaging matrix, for flat panel displays and solid state camera chips is the RGB color triad. The system takes advantage of the Von Bezold effect by separating the three colors and placing equal spatial frequency weight on each color. Two manufacturers have shown improvements in display design by using dual or triple panels whose images are superimposed. One manufacturer of projection displays used three panels, red, green, and blue. The blue panel uses reduced resolution in accordance with the match between human vision requirements and the displayed image. Another manufacturer, Planar Systems of Beaverton, Oreg. employs a "Multi-row Adressing" technique having a dual electroluminescent panel, one panel with red and green pixels, the other with blue pixels to build a developmental model. The blue pixels have reduced resolution in the vertical axis only. This allows the blue phosphors to be excited at a higher rate than the red and green pixels, thus overcoming a problem with lower blue phosphor brightness. The problem with the prior art is that in providing the same matched resolution balance between human vision and display, additional display panels/planes are used, along with additional driver electronics.

Other display methods such as disclosed in U.S. Pat. No. 6,008,868 issued Dec. 28, 1999 to Silverbrook use binary controlled emitters. In using binary controlled emitters, each emitter has a discrete luminance value, therefore, requiring the display to have an exact area to luminance relationship. This prior art used reduced blue "bit depth" built into the panel in accordance with human vision's lower blue color space increments. Conventional display methods also use a single color in a vertical stripe. Since conventional stripes have limited the Modulation Transfer Function (MTF), high spatial frequency resolution, in the horizontal axis, stripes of a single color are non-optimal.

BRIEF DESCRIPTION OF THE INVENTION

According to one aspect of the invention a three-color pixel element of spaced-apart emitters is disclosed. The pixel element consists of a blue emitter disposed at the center of a pair of opposing red and a pair of opposing green emitters. The plurality of pixel elements may be arranged in rows and columns to form a display. This array provides better perceived resolution and appearance of single full color displays by matching the human vision system.

According to another aspect of the invention, the drive matrix for the pixel array is disclosed. While the array consists of a plurality of rows and columns of the three-color pixel element of the present invention, the drive matrix consists of a plurality of row and column drivers to drive the individual emitters. The row drivers drive the red, green and blue emitters in each row, and the red and green emitters in each column are driven by a single column driver. However, a single column driver drives two columns of blue emitters. Thus, the number of drive lines and associated driver electronics used in the prior art are reduced in the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
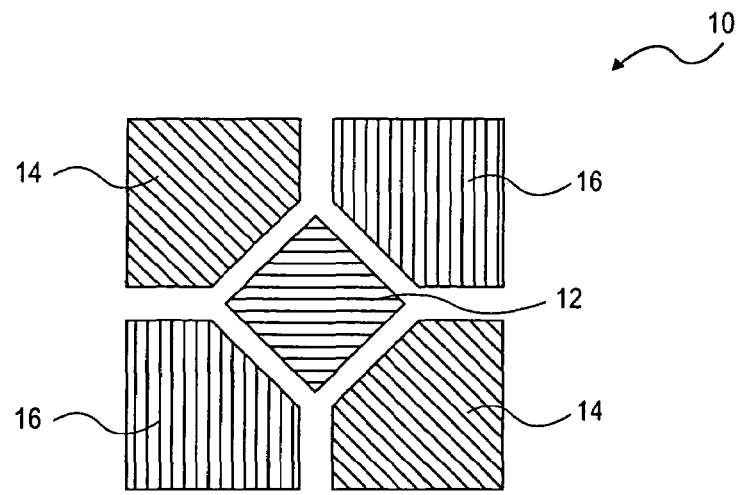
FIGS. 1a and 1b are arrangements of a three-color pixel element of the present invention.
Figure 1B:
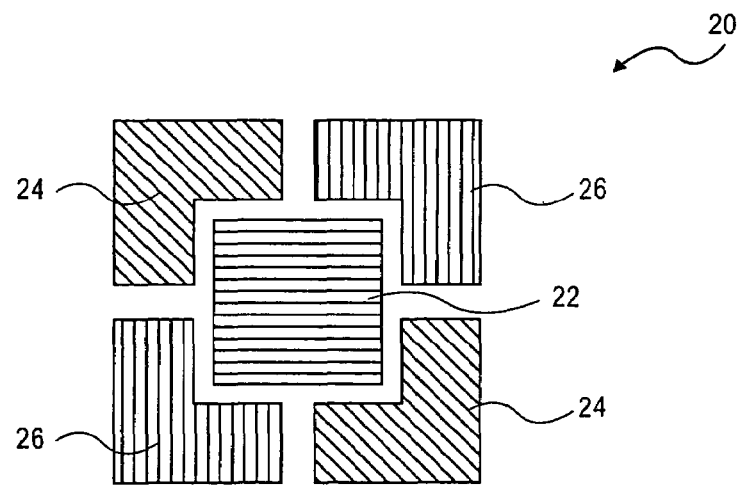

FIG. 1a shows an illustrative embodiment of an arrangement of a three-color pixel element 10 according to the present invention. The pixel element consists of a blue emitter 12, two red emitters 14, and two green emitters 16. The blue emitter 12 is disposed at the origin of a rectangular coordinate system having four quadrants, and the pair of red emitters 14, and the pair of green emitters 16 are disposed at opposing quadrants of the rectangular coordinate system. As shown in FIG. 1a, the blue emitter 12 is square shaped, having corners aligned at the x and y axes of the rectangular coordinate system, and the opposing pairs of red 14 and green 16 emitters are generally square shaped, having truncated inwardly-facing corners forming edges parallel to the sides of the blue emitter 12. u Another illustrative embodiment of a three-color pixel element 20 according to the present invention is shown in FIG. 1b. In this embodiment, a blue emitter 22 is square shaped having sides aligned parallel to the x and y axes of a rectangular coordinate system, while the opposing pairs of red 24 and green 26 emitters are L-shaped. The L-shaped emitters envelop the blue emitter having the inside corners of the L-shaped emitters aligned with the corners of the blue emitter.

According to a preferred embodiment of the present invention, the pixel has equal red, green and blue emitter area. This may be achieved by placing in the center of the pixel a blue emitter having an area larger than the areas of the individual red and green emitters. Those of ordinary skill in the art will recognize that, in other embodiment of the present invention, the area of the blue emitter may be smaller in relation to either the red or green emitters. The blue emitter may be brighter than either the red or green emitters, or it may be the same brightness as the red and green emitters. For example, the drive-to-luminance gain of the blue emitter may be greater than that of the red or green emitters.

Although the above description is illustrative of a preferred embodiment of the present invention, those of ordinary skill in the art will readily recognize other alternatives. For example, the emitters may have different shapes, such as rounded or polygonal. They may also be diffuse rather than having sharp edges. The pixels need not be arranged with equal spatial frequency in each axis. The aperture ratio between the emitters may be minimized to substantially non-existent or it may be very pronounced, and the space may also be different colors, including black or white. The emitters may be any technology known or invented in the future, such as displays using Liquid Crystal (LCD), Plasma, Thin Film Electroluminescent, Discrete Light Emitting Diode (LED), Polymer Light Emitting Diode, Electro-Chromic, Electro-Mechanical, Incandescent Bulb, or Field Emission excited phosphor (FED).

Figure 2:
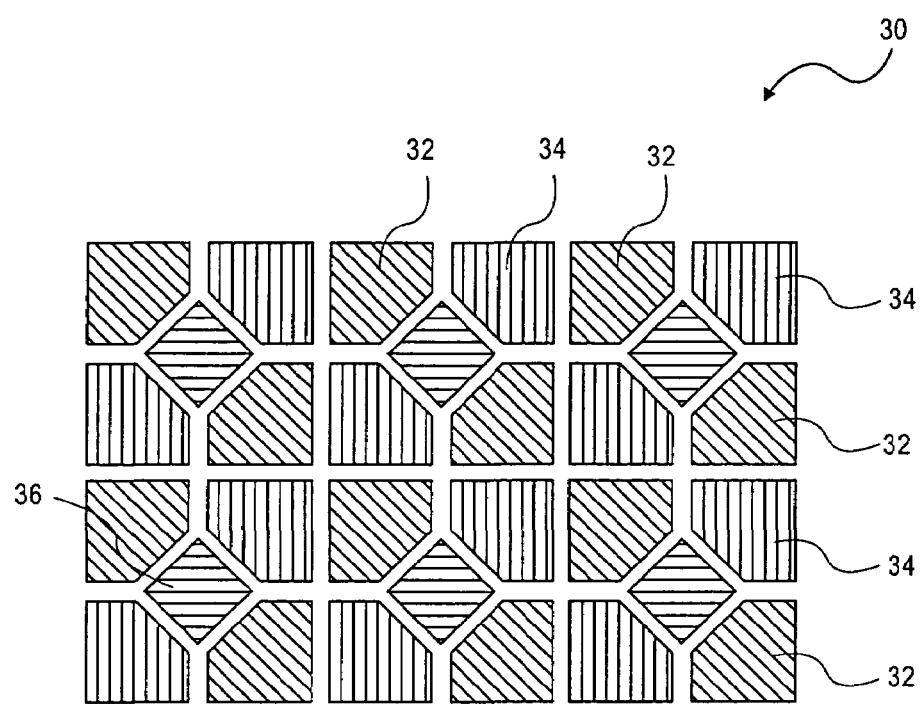
FIG. 2 is an array of three-color pixel elements of the present invention.

FIG. 2 is an array 30 of the three-color pixel element 10 of FIG. 1a. The array 30 is repeated across a panel or chip to complete a device with a desired matrix resolution. The repeating three-color pixels 10 form a "checker board" of alternating red 32 and green 34 emitters with blue emitters 36 distributed evenly across the device, but at half the resolution of the red 32 and green 34 emitters.

One advantage of the three-color pixel element array of the present invention is improved resolution of color displays. This occurs since only the red and green emitters contribute significantly to the perception of high resolution in the luminance channel. Thus reducing the number of blue emitters and replacing some with red and green emitters improves resolution by more closely matching human vision.

Dividing the red and green emitters in half in the vertical axis to increase spatial addressability is an improvement over the conventional vertical single color stripe of the prior art. An alternating "checkerboard" of red and green emitters allows the Modulation Transfer Function (MTF), high spatial frequency resolution, to increase in both the horizontal and the vertical axes.

The three-color pixel element array may also be used in solid state image capture devices found in modern consumer video cameras and electronic still cameras. An advantage of using the reduced blue emitter resolution in both image capture and display is that stored images do not need to supply the same resolution for each color in storage or processing. This presents potential savings during coding, compression, and decompression of electronically stored images, including software and hardware in electronic imaging and display systems such as computers, video games, and television, including High Definition Television (HDTV) recording, playback, broadcasting, and display.

Figure 3A:
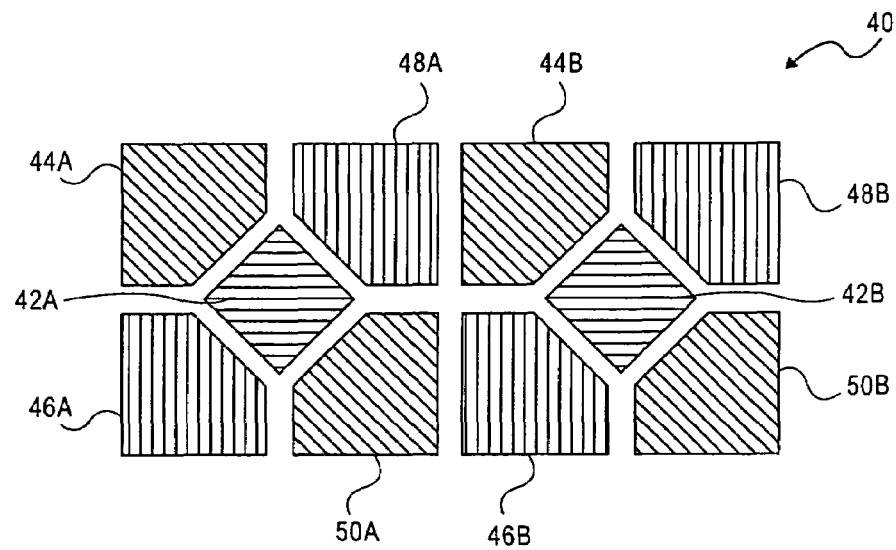
FIG. 3a is an arrangement of two three-color pixel elements of the present invention, aligned horizontally.

FIG. 3a is an arrangement 40 of two three-color pixel elements of the present invention aligned horizontally. A blue emitter 42a is disposed at the origin of a first three-color pixel element, and a blue emitter 42b is disposed at the origin of a second three-color pixel element. Red emitters 44a and 44b are disposed in the upper left corners of the first and second pixel elements. Green emitters 46a and 46b are disposed in the lower left corners of the first pixel and second pixel elements. Green emitters 48a and 48b are disposed in the upper right corners of each pixel element, and red emitters 50a and 50b are disposed in the lower right corners of each pixel element.

Figure 3B:
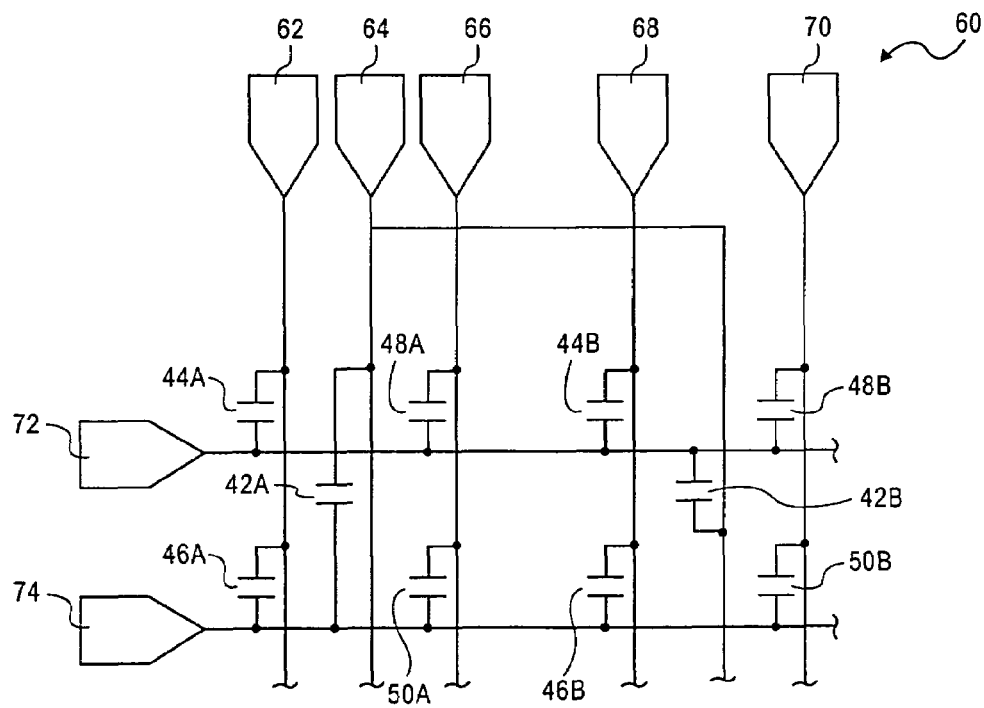
FIG. 3b is a diagram showing an illustrative drive matrix for the pixel arrangement of FIG. 3a according to the present invention.

FIG. 3b is a diagram of an illustrative drive matrix 60, according to the present invention, for the pixel arrangement 40. The emitters are schematically represented as capacitors for convenience. The emitters of the invention may be active electronic devices such as Thin Film Transistors (TFT) found in Active Matrix Liquid Crystal Display (AMLCD), or Charge Coupled Devices as found in camera chips, or other suitable devices.

The illustrative drive matrix 60 shown in FIG. 3b consists of a 2×5 drive matrix, where four column drivers drive the red and green emitters and a single column driver drives the blue emitters. A first column driver 62 drives the red emitter 44a and the green emitter 46a. The blue emitters 42a and 42b are tied together and driven by a second column driver 64. A third column driver 66 drives the green emitter 48a and the red emitter 50a, while a fourth column driver 68 drives the red emitter 44b and the green emitter 46b. The green emitter 48b and the red emitter 50b are driven by a fifth column driver 70.

The row drivers of the present invention drive the red, green and blue emitters in each row. Row driver 72 drives red emitters 44a and 44b, green emitters 48a and 48b, as well as blue emitter 42b. Row driver 74 drives green emitters 46a and 46b, red emitters 50a and 50b and blue emitter 42a. Each emitter can be driven at continuous luminance values at specific locations in a pixel, unlike emitters in the prior art, which are driven at discrete luminance values at random locations in a pixel.

The drive matrix disclosed in the present invention uses approximately 16% fewer column drivers to present a given image than does a prior art 2×6 drive matrix for the triad arrangement. The column drive lines are reduced since the blue emitters 12 are combined. This entire arrangement can be turned 90 degrees such that the combined blue emitters 12 are driven by the same row driver. All such topologically identical variants known in the art are possible embodiments of this invention. In addition, the driver type, voltage, and timing can be the same as already known in the art for each device technology.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A display comprising substantially a plurality of three-color pixel elements that form at least one row of said pixel elements, said three-color pixel element comprising:
   a blue emitter disposed at an origin of a rectangular coordinate system having four quadrants;
   a pair of red emitters spaced apart from said blue emitter and symmetrically disposed about said origin in a first pair of opposing quadrants of said rectangular coordinate system;
   a pair of green emitters spaced apart from said blue emitter and symmetrically disposed about said origin in a second pair of opposing quadrants of said rectangular coordinate system; and
   wherein said display further comprises at least first and second gate drivers oriented in a first direction and at least first and second data drivers oriented in a second direction different from said first direction;
   wherein a first blue emitter is connected to a first gate driver in said first direction and to a first data driver in said second direction; and
   wherein a second neighboring blue emitter is connected to said first data driver in said second direction.

2. The display of claim 1 wherein:
   said blue emitter is polygonal having corners aligned at x and y axes of said rectangular coordinate system;
   said red emitters are polygonal, each having an inwardly-facing edge parallel to a side of said polygonal blue emitter; and
   said green emitters are polygonal, each having an inwardly-facing edge to a side of said polygonal blue emitter.

3. The display of claim 2 wherein:
   said blue emitter is four-sided having equal internal angles, having corners aligned at x and y axes of said rectangular coordinate system;
   said red emitters are four-sided having equal internal angles, each having a truncated inwardly-facing corner forming an edge parallel to a side of said four-sided blue emitter; and
   said green emitters are four-sided having equal internal angles, each having a truncated inwardly-facing corner forming an edge parallel to a side of said four-sided blue emitter.

4. The display of claim 3 wherein:
   said blue emitter is square having corners aligned at x and y axes of said rectangular coordinate system;
   said red emitters are square, each having a truncated inwardly-facing corner forming an edge parallel to a side of said square blue emitter; and
   said green emitters are square, each having a truncated inwardly-facing corner forming an edge parallel to a side of said square blue emitter.

5. The display of claim 1 wherein:
   said blue emitter is square-shaped having sides aligned parallel to x and y axes of said rectangular coordinate system; and
   said red emitters and said green emitters are L-shaped and envelop said square blue emitter.

6. The display of claim 1 wherein said blue emitter comprises an emitting area larger than that of each of said red emitters and said green emitters.

7. The display of claim 1 wherein said blue emitter has a larger drive-to-luminance gain than that of each of said red emitters and said green emitters.

8. The display of claim 1 wherein said first and second directions of said gate and data drivers are substantially orthogonal.

9. The display of claim 1 wherein said first and second directions of said gate and data drivers are oriented along substantially mutually independent axes.

10. The display of claim 1 wherein said first direction is a row direction and said second direction is a column direction on said display.

11. The display of claim 1 wherein said first direction is a column direction and said second direction is a row direction on said display.

12. The display of claim 1 wherein said second neighboring blue emitter is further connected to a second gate driver in said first direction.

13. A display comprising substantially a plurality of three-color pixel elements that form at least one row of pixel elements, said three-color pixel element comprising:
   a pair of red emitters, outer corners of each forming a first two opposing corners of a square;
   a pair of green emitters, outer corners of each forming a second two opposing corners of said square;
   a blue emitter disposed at a center of said square;
   wherein said display further comprises at least first and second gate drivers oriented in a first direction and at least first and second data drivers oriented in a second direction different from said first direction;
   wherein a first blue emitter is connected to a first gate driver in said first direction and to a first data driver in said second direction; and
   wherein a second neighboring blue emitter is connected to a second gate driver in said first direction and to said first data driver in said second direction.

14. The display of claim 13 wherein:
   said blue emitter disposed at said center of said square and is polygonal having sides aligned such that imaginary lines perpendicularly bisecting each side pass through corners of said polygon;
   said red emitters are polygonal, each having an inwardly-facing edge parallel to an edge of said polygonal blue emitter; and
   said green emitters are polygonal, each having an inwardly-facing edge parallel an edge of said polygonal blue emitter.

15. The display of claim 14 wherein:
   said blue emitter disposed at said center of said square and is four-sided having equal internal angles, having sides aligned such that imaginary lines perpendicularly bisecting each side pass through said corners of said square;
   said red emitters are four-sided having equal internal angles, each having a truncated inwardly-facing corner forming a line parallel to an edge of said four-sided blue emitter; and
   said green emitters are four sided having equal internal angles, each having a truncated inwardly-facing corner forming a line parallel to an edge of said four-sided blue emitter.

16. The display of claim 15 wherein:
said blue emitter disposed at said center of said square and is square-shaped having sides aligned such that imaginary lines perpendicularly bisecting each side pass through said corners of said square;
said red emitters are square-shaped, each having a truncated inwardly-facing corner forming a line parallel to an edge of said four-sided blue emitter; and
said green emitters are square-shaped, each having a truncated inwardly-facing corner forming an edge parallel to a side of said four-sided blue emitter.

17. The display of claim 13 wherein:
said blue emitter disposed at said center of said square and is square-shaped having sides parallel to sides of said square;
said red emitters and green emitters are L-shaped and envelop said square-shaped blue emitter.

18. An array for a display comprising:
a plurality of row positions;
a plurality of column positions; and
a plurality of three-color pixel elements, one of said elements disposed in each of said row positions and said column positions, each of said three-color pixel elements comprising:
a blue emitter disposed at an origin of a rectangular coordinate system having four quadrants;
a pair of red emitters spaced apart from said blue emitter and symmetrically disposed about said origin in a first pair of opposing quadrants of said rectangular coordinate system;
a pair of green emitters spaced apart from said blue emitter and symmetrically disposed about said origin in a second pair of opposing quadrants of said rectangular coordinate system; and
wherein each said emitter is connected to a column driver and at least two neighboring blue emitters in a same row are connected to the same column driver.

19. The array of claim 18 wherein the spatial frequency of each said three-color pixel element in a row direction is greater than in the column direction.

20. The array of claim 18 wherein the spatial frequency of each said three-color pixel element in a column direction is greater than in the row direction.

21. An array for a display comprising:
a plurality of row positions;
a plurality of column positions; and
a plurality of three-color pixel elements, one of said elements disposed in each of said row positions and said column positions, each of said three-color pixel elements comprising:
a blue emitter disposed at a center of said square;
a pair of red emitters spaced apart from said blue emitter, outer corners of each forming a first two opposing corners of a square
a pair of green emitters spaced apart from said blue emitter, outer corners of each forming a second two opposing corners of said square; and
wherein each said emitter is connected to a column driver and at least two neighboring blue emitters in a same row are connected to the same column driver.

22. The array of claim 21 wherein the spatial frequency of each said three-color pixel element in a row direction is greater than in the column direction.

23. The array of claim 21 wherein the spatial frequency of each said three-color pixel element in a column direction is greater than in the row direction.

24. In an array of three-color pixel elements, a row structure comprising:
first and second three-color pixel elements, each three-color pixel element including first and second red emitters, first and second green emitters, and a blue emitter,
first and second row line drivers;
a first row line coupled to said first row line driver, said first row line coupled to said blue emitter of said second three-color pixel element, and said first red emitter and said first green emitter of said first and said second three-color pixel element;
a second row line coupled to said second row line driver, said second row line coupled to said blue emitter of said first three-color pixel element, and said second red emitter and said second green emitter of said first and said second three-color pixel element;
first through fifth column line drivers;
a first column line coupled to said first column line driver, said first column line coupled to said first red emitter and said second green emitter of said first three-color pixel element;
a second column line coupled to said second column line driver, said second column line coupled to said blue emitter of said first and said second three-color pixel element;
a third column line coupled to said third column line driver, said third column line coupled to said second red emitter and said first green emitter of said first three-color pixel element;
a fourth column line coupled to said fourth column line driver, said fourth column line coupled to said first red emitter and said second green emitter of said second three-color pixel element; and
a fifth column line coupled to said fifth column line driver, said fifth column line coupled to said second red emitter and said first green emitter of said second three-color pixel element.

25. An array comprising:
a plurality of rows, each row comprising:
first and second three-color pixel elements, each three-color pixel element including first and second red emitters, first and second green emitters, and a blue emitter;
first and second row line drivers;
a first row line coupled to said first row line driver, said first row line coupled to said blue emitter of said second three-color pixel element, and said first red emitter and said first green emitter of said first and said second three-color pixel element;
a second row line coupled to said second row line driver, said second row line coupled to said blue emitter of said first three-color pixel element, and said second red emitter and said second green emitter of said first and said second three-color pixel element;
first through fifth column line drivers;
a first column line coupled to said first column line driver, said first column line spanning said plurality of rows, said first column line coupled to said first red emitter and said second green emitter of each said first three-color pixel element in each row;
a second column line coupled to said second column line driver, said second column line spanning said plurality of rows, said second column line coupled to ach said blue emitter of said first and second three-color pixel element in each row;

a third column line coupled to said third column line driver, said third column line spanning said plurality of rows, said third column line coupled to said second red emitter and said first green emitter of each said first three color pixel element in each row;

a fourth column line coupled to said fourth column line driver, said fourth column line spanning said plurality of rows, said fourth column line coupled to said first red emitter and said second green emitter of each said second three-color pixel element in each row; and a fifth column line coupled to said fifth column line driver, said fifth column line spanning said plurality of rows, said fifth column line coupled to said second red emitter and said first green emitter of each said second three-color pixel element in each row.

26. An image capture device comprising a plurality of three-color pixel elements that form at least one row of pixel elements; each three-color pixel element comprising:
 a blue emitter disposed at an origin of a rectangular coordinate system having four quadrants;
 a pair of red emitters spaced apart from said blue emitter and symmetrically disposed about said origin in a first pair of opposing quadrants of said rectangular coordinate system;
 a pair of green emitters spaced apart from said blue emitter and symmetrically disposed about said origin in a second pair of opposing quadrants of said rectangular coordinate system; and
 wherein each said emitter is connected to a column driver and at least two neighboring blue emitters in a same row are connected to the same column driver.

27. A display substantially comprising
 at least first and second gate drivers oriented in a first direction and at least first and second data drivers oriented in a second direction different from said first direction; and
 a plurality of three-color pixel elements that form at least one row of pixel elements, each three-color pixel element comprising:
 a blue emitter;
 a pair of red emitters;
 a pair of green emitters such that said red emitters and said green emitters form substantially a checkerboard pattern upon said display; and
 wherein a first blue emitter is connected to a first gate driver in said first direction and to a first data driver in said second direction; and wherein a second neighboring blue emitter is connected to said first data driver in said second direction.

28. The display of claim 27 wherein each three-color pixel element further comprises one of a group of patterns, said group comprising:

G R     R G
B          B
R G And G R.

29. The display of claim 27 wherein said display is one of a group comprising a liquid crystal display, an organic light emitting diode display, an electro luminescent display, a plasma display, and a field emission display.

30. The display of claim 27 wherein said first direction is a column direction.

31. The display of claim 27 wherein said first direction is a row direction.

32. The display of claim 27 wherein said second neighboring blue emitter is further connected to a second gate driver in said first direction.

* * * * *